(12) United States Patent
Imai

(10) Patent No.: US 12,217,481 B2
(45) Date of Patent: Feb. 4, 2025

(54) SIMILAR DRAWING SEARCH DEVICE, SIMILAR DRAWING SEARCH METHOD, AND COMPUTER-READABLE MEDIUM

(71) Applicant: CADDi, Inc., Tokyo (JP)

(72) Inventor: Takeaki Imai, Tokyo (JP)

(73) Assignee: CADDi, Inc., Tokyo (JP)

( * ) Notice: Subject to any disclaimer, the term of this patent is extended or adjusted under 35 U.S.C. 154(b) by 0 days.

(21) Appl. No.: 18/785,515

(22) Filed: Jul. 26, 2024

(65) Prior Publication Data

US 2024/0386698 A1 Nov. 21, 2024

Related U.S. Application Data

(63) Continuation of application No. PCT/JP2023/022222, filed on Jun. 15, 2023.

(51) Int. Cl.

| | |
|---|---|
| G06T 7/50 | (2017.01) |
| G06T 11/20 | (2006.01) |
| G06V 10/25 | (2022.01) |
| G06V 10/44 | (2022.01) |
| G06V 10/74 | (2022.01) |

(52) U.S. Cl.
CPC ............. G06V 10/761 (2022.01); G06T 7/50 (2017.01); G06T 11/203 (2013.01); G06V 10/25 (2022.01); G06V 10/44 (2022.01)

(58) Field of Classification Search
CPC ........ G06V 10/25; G06V 10/761; G06T 7/50; G06T 11/203
See application file for complete search history.

(56) References Cited

U.S. PATENT DOCUMENTS

| | | | |
|---|---|---|---|
| 2009/0199081 A1* | 8/2009 | Arida | G06F 16/958 |
| | | | 719/329 |
| 2022/0075815 A1 | 3/2022 | Akimoto et al. | |
| 2023/0049798 A1 | 2/2023 | Mizui et al. | |

FOREIGN PATENT DOCUMENTS

| | | | |
|---|---|---|---|
| JP | 2001-084263 A | 3/2001 | |
| JP | 2018-081452 A | 5/2018 | |

(Continued)

OTHER PUBLICATIONS

International Search Report received in PCT Application No. PCT/JP2023/022222, dated Aug. 8, 2023.

(Continued)

*Primary Examiner* — Sam Bhattacharya
(74) *Attorney, Agent, or Firm* — Rimon P.C.

(57) ABSTRACT

A similar drawing search device according to an embodiment configured to search for a drawing similar to a target drawing from a drawing database that stores feature information on a shape of a component in each drawing and drawing information on the component in the drawing in association with each other for a plurality of drawings. The similar drawing search device configured to acquire, from the target drawing, feature information related to a shape of a component in the target drawing; acquire, from the target drawing, drawing information on the component in the target drawing; search the drawing database for a plurality of first similar drawings, based on the feature information of the target drawing; narrow down the plurality of first similar drawings to a plurality of second similar drawings, based on the drawing information of the target drawing; and display the plurality of second similar drawings.

12 Claims, 11 Drawing Sheets

(56) References Cited

FOREIGN PATENT DOCUMENTS

| JP | 2018-165926 A | 10/2018 |
| JP | 2019-175463 A | 10/2019 |
| JP | 2020-074111 A | 5/2020 |
| JP | 2020-091769 A | 6/2020 |
| JP | 2021-135611 A | 9/2021 |
| JP | 2021-157506 A | 10/2021 |
| WO | 2020/099985 A1 | 5/2020 |
| WO | 2021/220829 A1 | 11/2021 |

OTHER PUBLICATIONS

Decision to Grant a Patent received in Japanese Patent Application No. 2022-099557, dated Oct. 10, 2023.

* cited by examiner

SIMILAR DRAWING SEARCH DEVICE, SIMILAR DRAWING SEARCH METHOD, AND COMPUTER-READABLE MEDIUM

CROSS-REFERENCE TO RELATED APPLICATIONS

This application is a continuation of International Application No. PCT/JP2023/022222, filed on Jun. 15, 2023 which claims the benefit of priority of the prior Japanese Patent Application No. 2022-099557, filed on Jun. 21, 2022, the entire contents of which are incorporated herein by reference.

FIELD

An embodiment of the present invention relates to a similar drawing search device, a similar drawing search method, and a computer-readable medium.

BACKGROUND

Conventionally, in the case of a user having an order amount of a large product in design and procurement, an order operation of drawings related to the product may be frequently performed. Therefore, a large amount of data of the drawings is created. For the purpose of improving the efficiency of product ordering and receiving service by utilizing a large amount of drawing data created in the product ordering and receiving service, for example, there is a case where it is desired to refer to drawing information similar to the past.

A related technique is disclosed in JP 2020-91769 A.

Due to complicated requirements regarding similarity between past drawings and desired drawings, a user may not be able to easily search for similar drawings.

SUMMARY

A similar drawing search device according to an embodiment is configured to search for a drawing similar to a target drawing from a drawing database that stores feature information on a shape of a component in each drawing and drawing information on the component in the drawing in association with each other for a plurality of drawings. The similar drawing search device includes a feature information acquisition unit, a drawing information acquisition unit, a similar drawing search unit, a drawing narrowing unit, and a display unit. The feature information acquisition unit is configured to acquire, from the target drawing, feature information related to a shape of a component in the target drawing. The drawing information acquisition unit is configured to acquire, from the target drawing, drawing information on the component in the target drawing. The similar drawing search unit is configured to search the drawing database for a plurality of first similar drawings, based on the feature information of the target drawing. The drawing narrowing unit is configured to narrow down the plurality of first similar drawings to a plurality of second similar drawings, based on the drawing information of the target drawing. The display unit is configured to display the plurality of second similar drawings.

DETAILED DESCRIPTION

Hereinafter, embodiments will be described in detail with reference to the drawings.

Figure 1:
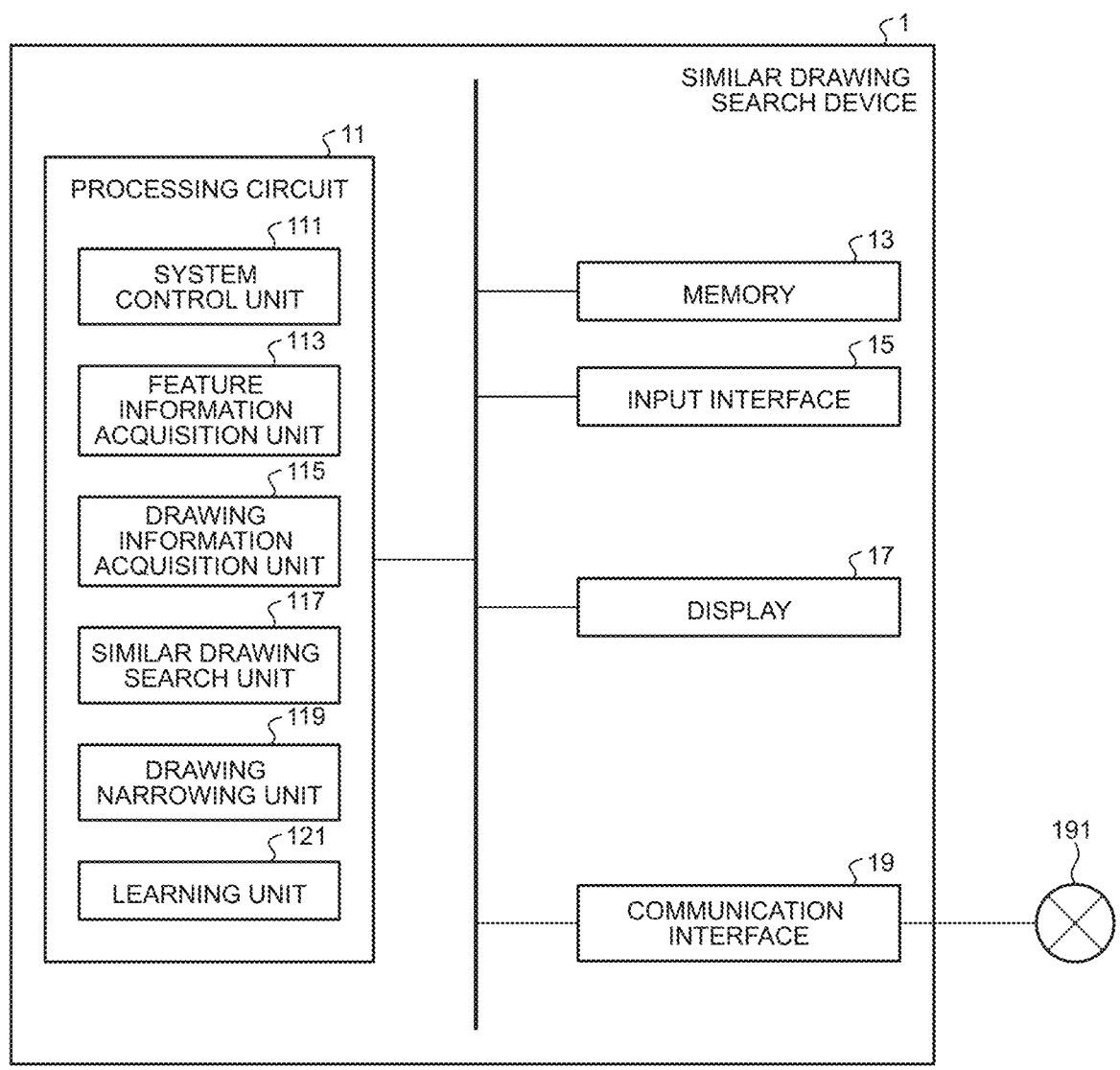
FIG. 1 is a diagram illustrating an example of a hardware configuration of a similar drawing search device 1 according to an embodiment.

FIG. 1 is a diagram illustrating an example of a hardware configuration of a similar drawing search device 1 according to the present embodiment. The similar drawing search device 1 is a device that searches for a drawing similar to a target drawing from a drawing database in which feature information on a shape of a component in each drawing and drawing information on the component in each drawing are stored in association with each other with respect to a plurality of drawings. The components in the drawings correspond to, for example, component information corresponding to a component drawing indicating a drawing limited to one perspective of a metal processed product or the like, an assembly drawing combining the component drawings, a circuit diagram, and the like. Hereinafter, in order to simplify the description, the component will be described as a component drawing.

As illustrated in FIG. 1, the similar drawing search device 1 includes a processing circuit 11, a memory 13, an input interface 15, a display 17, and a communication interface 19. As illustrated in FIG. 1, the processing circuit 11, the memory 13, the input interface 15, the display 17, and the communication interface 19 are electrically connected through a bus. Therefore, data is appropriately transmitted and received to and from the processing circuit 11, the memory 13, the input interface 15, the display 17, and the communication interface 19 under the control of a system control unit 111.

Note that the memory 13 may be realized as a storage device corresponding to a storage. The memory 13 corresponds to a storage unit. The input interface 15 corresponds to an input unit. The display 17 corresponds to a display unit. The communication interface 19 corresponds to a communication unit.

The processing circuit 11 includes, for example, a processor and an internal memory as hardware resources. Note that the processing circuit 11 may be realized by a computer or the like. In addition, the processor is realized by, for example, a central processing unit (CPU), a graphics processing unit (GPU), a micro processing unit (MPU), a field programmable gate array (FPGA), an application specific integrated circuit (ASIC), a complex programmable logic device (CPLD), a simple programmable logic device (SPLD), or the like. The internal memory is realized by, for example, a read only memory (ROM) and/or a random access memory (RAM). The hardware that realizes the processor and the internal memory is not limited to the above, and known hardware can be used as appropriate.

The system control unit 111, a feature information acquisition unit 113, a drawing information acquisition unit 115, a similar drawing search unit 117, the drawing narrowing unit 119, and a learning unit 121 that implement various functions by the processing circuit 11 will be described later.

The memory 13 is a storage device such as a hard disk drive (HDD), a solid state drive (SSD), or an integrated circuit storage device that stores various types of information. The memory 13 stores various programs according to the present embodiment. For example, the memory 13 stores a program related to execution of processing in each of the system control unit 111, the feature information acquisition unit 113, the drawing information acquisition unit 115, the similar drawing search unit 117, the drawing narrowing unit 119, and the learning unit 121 executed by the processing circuit 11.

The memory 13 stores, for example, each of a plurality of drawings as drawing data. In addition, the memory 13 stores each of the plurality of drawings, feature information regarding a shape of a component drawing in each of the plurality of drawings, and drawing information regarding the component drawing in association with a drawing ID of each of the plurality of drawings. The drawing ID, the feature information, and the drawing information may be referred to as index data. Each of the plurality of drawings is stored in the memory 13 as drawing data. The index data and the drawing data are stored in the memory 13 as a database (hereinafter, referred to as a drawing database) relating to a plurality of drawings. Hereinafter, each of the plurality of drawings stored in the drawing database is referred to as a database drawing.

The drawing information includes, for example, at least one of a text attached to the component drawing in the drawing, estimation information estimated based on the text, and symbol information attached to the component drawing. The text is, for example, character information and numerical information attached to the drawings. Specifically, the text is a drawing number, a figure number, a product name, a material, information regarding processing (for example, surface treatment) described in a title field of the drawing, a dimensional value and the number of holes described in the component drawing, information given to each drawing by a user, and the like.

Furthermore, the symbol information attached to the component drawing is, for example, information regarding a symbol that abbreviates the text or the like and/or a symbol given by the user.

Figure 2:
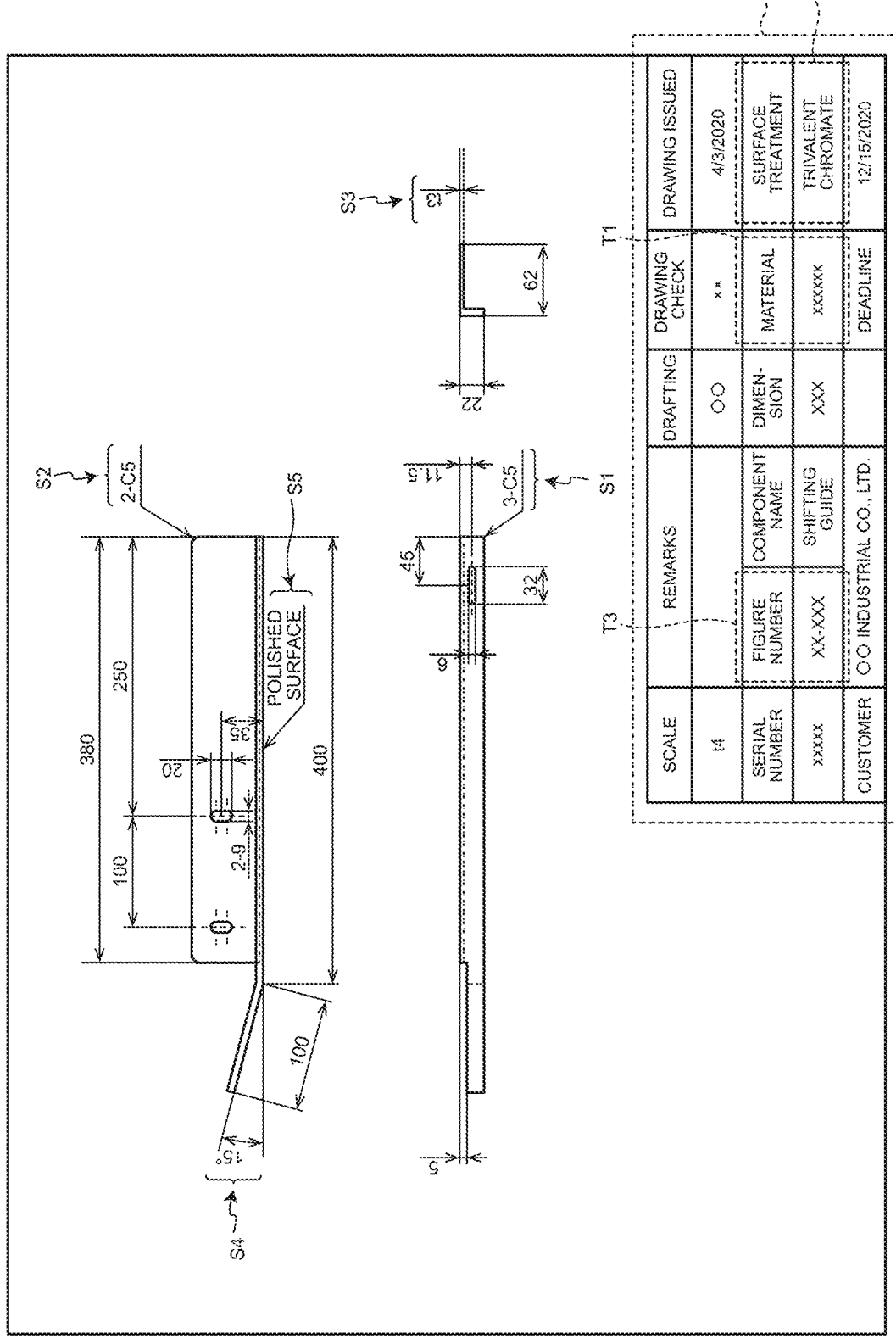
FIG. 2 is a diagram illustrating an example of drawing data according to the embodiment.

FIG. 2 is a diagram illustrating an example of drawing data. As illustrated in FIG. 2, the text in the drawing information includes a text (S4 or the like) attached to the component drawing and a text (T1, T2, T3, etc.) described in a title block T. The symbol information attached to the component drawing is, for example, symbols in S1, S2, S3, and the like as illustrated in FIG. 2. A process of acquiring the drawing information from the drawings will be described in the drawing information acquisition unit 115.

The estimation information in the drawing information is, for example, an estimation value (a maximum dimension of a component drawing, or the like) estimated from a dimension value, a base material shape, a processing method, a price, or the like. Here, the base material shape indicates a shape of a material before being processed by sheet metal processing or machining (milling and lathe) in the manufacture of the component drawing illustrated in the drawings. In manufacturing a component corresponding to the component drawing, materials having these base material shapes are selected during processing, and processing is performed.

Figure 3:
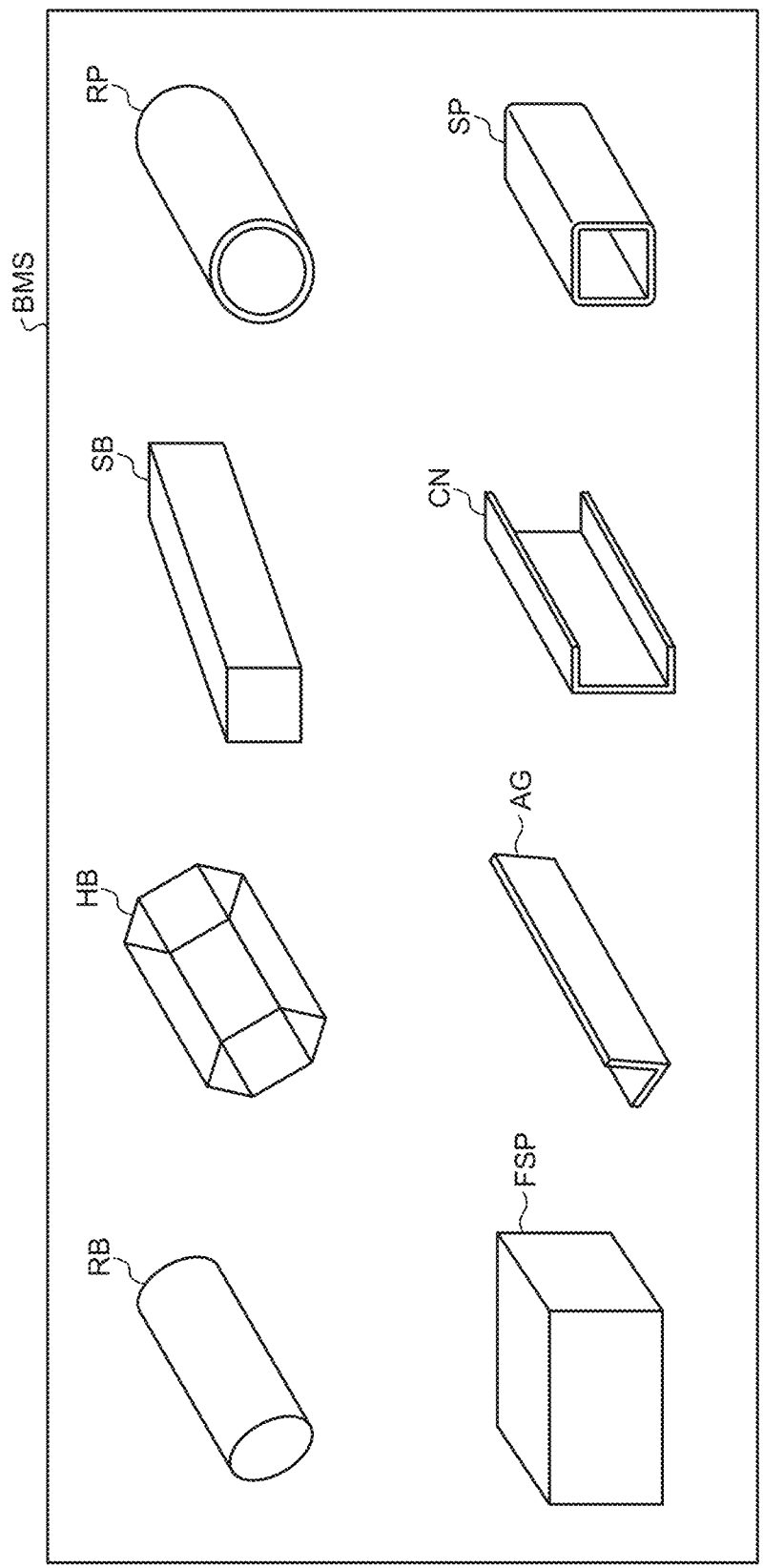
FIG. 3 is a diagram illustrating an example of a base material shape BMS according to the embodiment.

FIG. 3 is a diagram illustrating an example of the base material shape BMS. As illustrated in FIG. 3, the base material shape BMS is, for example, a round bar RB, a hexagonal bar HB, a square bar SB, a round pipe RP, a flat steel plate FSP, an angle AG, a channel CN, a square pipe SP, or the like. The base material shape BMS is not limited to the example illustrated in FIG. 3, and may be another shape. The estimation of the base material shape will be described in the drawing information acquisition unit 115.

Examples of the processing method include sheet metal processing and machining. The machining is, for example, a milling machine, a lathe, or the like. The processing method is not limited thereto, and may be a known processing method. The price is a price related to manufacturing of a component corresponding to the component drawing, and is, for example, a sum of a material cost (cost of a base material) and a processing cost. The price is not limited thereto, and may be other costs. The estimation of the price will be described in the drawing information acquisition unit 115.

In addition, the memory 13 stores a learned model that receives, as an input, a drawing (hereinafter, the drawings are referred to as target drawings) that is a target for searching for a similar drawing and outputs an estimation result estimated on the basis of feature information. Here, the estimation result is, for example, at least one of a plurality of items regarding a product/processing including a product category, dimensions before and after processing, a processing process category, a processing method, presence/absence of bending, and presence/absence of welding with respect to the target drawing. The feature information stored in the memory 13 is at least one of an intermediate output of a target drawing output from at least one intermediate layer in the learned model and a characteristic of a shape of a component in a component drawing by image processing on the component drawing. The learned model is a model capable of outputting an intermediate feature between input and output, and is, for example, a model configured by a multilayer neural network. Each of the intermediate output and the characteristic is expressed by a vector. Here, the characteristic of the shape of the component is, for example, a characteristic of the shape characterizing the entire component corresponding to the component drawing, and is, for example, a statistical aggregation of components in edge directions (four directions or eight directions). Acquisition of the shape characteristics of the component will be described in the feature information acquisition unit 113.

The memory 13 stores a calculation formula for calculating similarity between each of the plurality of database drawings and the target drawing as a score using similarity between features expressed by vectors, and a first weight and a second weight used in the calculation formula. Determination of the first weight and the second weight will be described later.

The first weight is multiplied by, for example, similarity (Hereinafter, referred to as intermediate output similarity) calculated by the intermediate output regarding each of the plurality of database drawings and the intermediate output regarding the target drawing. Furthermore, the second weight is multiplied by, for example, similarity (hereinafter, referred to as characteristic similarity) calculated by the characteristic regarding each of the plurality of database drawings and the characteristic regarding the target drawing. The calculation formula for calculating the score is expressed by, for example, score=first weight×intermediate output similarity+second weight×characteristic similarity. As illustrated in the calculation formula for calculating the score indicating the similarity, the first weight and the second weight numerically indicate which similarity (that is, any of the similarity by the intermediate output and the similarity of the shape characteristic) based on the feature between the intermediate output similarity and the characteristic similarity is to be emphasized as reliability. Note that the sum of the first weight and the second weight may be set in advance to be 1. Acquisition of features (intermediate output and shape characteristics) regarding each of the plurality of database drawings stored in the memory 13, setting of the first weight and the second weight, and the like will be described later.

The memory 13 may be a drive device that reads and writes various types of information from and to a portable storage medium such as a compact disc (CD), a digital versatile disc (DVD), or a flash memory, a semiconductor memory element such as a random access memory (RAM), or the like, in addition to an HDD, an SSD, or the like. Note that a storage area of the memory 13 may be in the similar drawing search device 1 or may be provided in an external storage device connected through the network 31.

The input interface 15 receives input operation related to various instructions from the user, converts the received input operation into an electric signal, and outputs the electric signal to the processing circuit 11. As the input interface 15, for example, a mouse, a keyboard, a trackball, a switch, a button, a joystick, a touch pad, a touch panel display, and the like can be appropriately used. Note that, in the present embodiment, the input interface 15 is not limited to one including physical operation components such as a mouse, a keyboard, a trackball, a switch, a button, a joystick, a touch pad, and a touch panel display. For example, an electric signal processing circuit that receives an electric signal corresponding to an input operation from an external input device provided separately from the similar drawing search device 1 and outputs the electric signal to the processing circuit 11 is also included in the example of the input interface 15.

The display 17 displays various types of information. For example, the display 17 outputs a search result of the similar drawings by the processing circuit 11, a graphical user interface (GUI) for receiving various operations from the user, and the like. As the display 17, for example, a liquid crystal display (LCD), a cathode ray tube (CRT) display, an organic EL display (OELD: organic electro luminescence display), a plasma display, or any other display can be appropriately used. In addition, the display 17 may be a desktop type, or may be a tablet terminal or the like that can wirelessly communicate with the similar drawing search device 1.

The communication interface 19 performs data communication with another input/output device through a network 191, for example. The communication standard of the communication interface 19 may be any standard. The communication interface 19 outputs drawing data acquired by data communication with another input/output device to the memory 13. The communication interface 19 receives an electric signal of an input operation input to another input interface in another input/output device. The communication interface 19 outputs the received electric signal to the processing circuit 11.

The system control unit 111 controls processing of each unit in the processing circuit 11 on the basis of an electric signal corresponding to an input operation received from the user through the input interface 15. Specifically, the system control unit 111 reads a control program stored in the memory 13, develops the control program on an internal memory in the processing circuit 11, and controls each unit of the similar drawing search device 1 according to the developed control program.

The feature information acquisition unit 113 acquires feature information regarding the shape of the component drawing in the target drawing from the target drawing input by the user through the input interface 15. The feature information acquisition unit 113 stores the acquired feature information in the memory 13 in association with the ID of the target drawing.

For example, the feature information acquisition unit 113 inputs the target drawing to the learned model, and acquires an intermediate output output from at least one intermediate layer in the learned model as feature information regarding the shape of the component drawing. The learned model is realized by the learned convolutional neural networks (CNN). As the learned CNN, for example, Efficient Net disclosed in (1905.11946) Efficient Net: Rethinking Model Scaling for Convolutional Neural Networks is used.

The image format input to the learned model is, for example, any two-dimensional drawing such as a portable network graphics (PNG) format or a tagged image file format (TIFF) format. Note that the image format is not limited to the above. Furthermore, the target drawing input to the learned model may be a handwritten drawing by the user. When the target drawing is a three-dimensional computer-aided design (CAD) drawing, the drawing input to the learned model may be an image (hereinafter, referred to as a rendering image) obtained by rendering a three-dimensional CAD drawing. The rendering processing may be executed by the feature information acquisition unit 113, or may be executed by another unit or an external device through the communication interface 19 and the network 191. The rendering image is, for example, a three-view view, for example, a plan view, a front view, a side view (right side view), or the like.

Note that the target drawing input to the learned model may be obtained by extracting area of the component drawing from the target drawing. At this time, prior to execution of the learned model, the feature information acquisition unit 113 extracts area of the component drawing by predetermined extraction processing on the drawing. Since various types of image processing such as existing segmentation processing can be used for the extraction processing, a description thereof will be omitted. Next, the feature information acquisition unit 113 acquires an intermediate output related to the target drawing by inputting data of the component drawing to the learned model. Note that the intermediate output may be a vector output from any intermediate layer among the plurality of intermediate layers in the learned model, but preferably, the intermediate output input to the output layer (layer that outputs an estimation result of the base material shape and the like) in the learned model, that is, the intermediate output from the intermediate layer (hereinafter, referred to as a last intermediate layer) immediately before the output layer is desirable. Note that the intermediate output may be an output from an intermediate layer other than the last intermediate layer, or may be an output from a plurality of intermediate layers.

The learned model is generated by inputting each of a plurality of database drawings stored in a drawing database to a model before learning and learning the model before learning using each of a plurality of estimation results corresponding to the plurality of database drawings as teacher data. Here, each of the plurality of estimation results is, for each of the plurality of database drawings, at least one of a plurality of items related to a product and processing including, for example, a product category, dimensions before and after processing, a processing process category, a processing method, presence or absence of bending processing, and presence or absence of welding processing. That is, the learned model is generated by, for example, causing a multilayer neural network that can output from the intermediate layer, to learn by using a database drawing and at least one of a plurality of items related to a product/processing related to the database drawing as learning data. For example, when the product category is teacher data, the learned model is generated by inputting a drawing as an image to a convolutional neural network (CNN), and causing the CNN to learn to classify classes of the product category into eight classes. Since a known method can be applied to the generation of the learned model, a description thereof will be omitted.

The feature information acquisition unit 113 acquires a characteristic of a shape of a component in the component drawing of the target drawing by image processing on the target drawing. At this time, the target of the image processing is not limited to the target drawing, and may be a drawing area (component drawing) obtained by extracting an outer frame and the title block T from the target drawing. For example, the feature information acquisition unit 113 acquires, as a characteristic, a vector obtained by statistically aggregating components in edge directions (four directions or eight directions) by image processing on a component drawing of a target drawing. Note that the shape characteristics are not limited to those related to the edge direction, and for example, as described in Distinctive Image Features from Scale-Invariant Keypoints David G. Lowe Jan. 5, 2004 the International Journal of Computer Vision, 2004. https://www.robots.ox.ac.uk/~vgg/research/affine/det_eval_f iles/lowe_ijcv2004.pdf, local features may be acquired and aggregated over the entire image.

In addition, when the acquired local features are aggregated in the entire image, for example, a codebook vector may be set in advance such as Bag-of-features described in T. Joachims: "Text categorization with support vector machines: learning with many relevant features", Proc. 10$^{th}$ European Conference on Machine Leaning (ECML-98), pp 137-142 (1998), and a histogram feature for aggregating the frequency of each codebook in the image may be used.

The drawing information acquisition unit 115 acquires drawing information on the component drawing from the target drawing input by the user through the input interface 15. The drawing information acquisition unit 115 stores the acquired drawing information in the memory 13 in association with the ID of the target drawing.

Specifically, the drawing information acquisition unit 115 acquires a text attached to the component drawing from the target drawing. The drawing information acquisition unit 115 acquires, for example, character information (for example, T1, T2, T3 illustrated in FIG. 2, and the like) described in the title block T and numerical information (for example, S4 illustrated in FIG. 2, and the like) attached to the component drawing as texts. Further, the drawing information acquisition unit 115 acquires symbol information attached to a component drawing of the target drawing from the target drawing. The drawing information acquisition unit 115 acquires, for example, a symbol (for example, S1, S2, S3 illustrated in FIG. 2, and the like) attached to the component drawing as symbol information. As processing of acquiring text and/or symbol information from the target drawing, for example, a known technique such as optical character recognition/reader (OCR: optical character recognition) can be applied, and thus a description thereof will be omitted.

The drawing information acquisition unit 115 acquires, as drawing information, estimation information estimated based on the acquired text. For example, the drawing information acquisition unit 115 acquires an estimated value such as a maximum dimension as estimation information by predetermined calculation or the like on numerical information such as a dimension value. In addition, the drawing information acquisition unit 115 estimates a base material shape, a processing method, a price, or the like on the basis of numerical information such as a dimension value attached to the text described in the title block T and/or the component drawing. The drawing information acquisition unit 115 acquires estimation information such as the estimated base material shape, processing method, or price as drawing information. Note that the drawing information acquisition unit 115 may estimate the shape of the base material, the processing method, the price, or the like by inputting the component drawing to the learned model. Since a known method can be applied to the estimation of the shape of the base material, the processing method, the price, or the like, a description thereof will be omitted.

Based on the features of the target drawing acquired by the feature information acquisition unit 113, the similar drawing search unit 117 searches a drawing database in which a plurality of drawings (database drawings) and features related to each of a plurality of database drawings are stored in association with each other, for a plurality of first similar drawings similar to component drawings in the target drawing.

For example, the similar drawing search unit 117 may calculate the similarity between each of the plurality of database drawings and the target drawing by using similarity between features expressed by vectors. The similarity between the features is calculated by, for example, cosine similarity expressed by the following Expression (1).

$$\text{Similarity} = \frac{\sum_{i=1}^{n} A_i B_i}{\sqrt{\sum_{i=1}^{n} A_i^2} \sqrt{\sum_{i=1}^{n} B_i^2}} \quad (1)$$

$A_i$ in Expression (1) represents an i component of a vector indicating a feature of the target drawing. In addition, Bi in Expression (1) represents an i component of a vector indicating a feature of the database drawing. n represents the number (dimension) of components of a vector indicating a feature of the target drawing and a vector indicating a feature of the database drawing. Also, the similarity shown in Expression (1) may be calculated for each of the intermediate output and shape characteristics.

Furthermore, the similar drawing search unit 117 may calculate, for example, a Euclidean distance expressed by the following Expression (2) as the similarity between the features. Hereinafter, a distance related to the two intermediate outputs is referred to as an intermediate output distance, and a distance related to the two characteristics is referred to as a characteristic distance. That is, the intermediate output similarity is expressed by, for example, an intermediate output distance or cosine similarity by two intermediate outputs. In addition, the characteristic similarity is expressed by, for example, the characteristic distance or cosine similarity according to two characteristics.

$$d(x,y) = \sqrt{(x_1-y_1) + \ldots + (x_n-y_n)^2} \qquad (2)$$

A left side d (x, y) in Expression (2) indicates the Euclidean distance. In addition, x in Expression (2) represents a vector indicating a feature of the target drawing. In addition, y in Expression (2) represents a vector indicating a feature of the database drawing. n represents the number (dimension) of components of a vector indicating a feature of the target drawing and a vector indicating a feature of the database drawing. The Euclidean distance d (x, y) shown in Expression (2) may be calculated for each of the intermediate output and shape characteristics.

Figure 4:
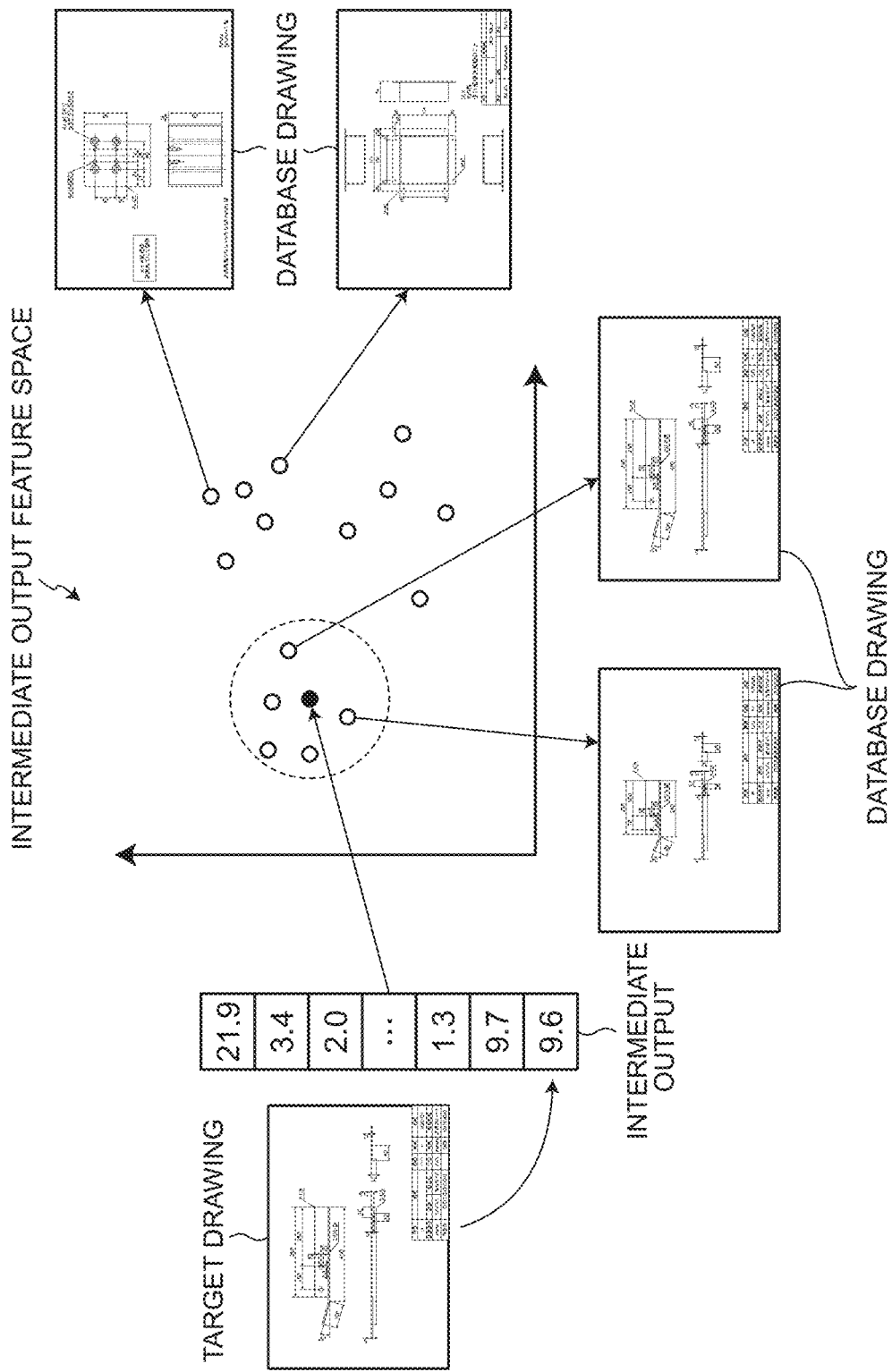
FIG. 4 is a diagram illustrating an example of a position of an intermediate output in a target drawing and a position of an intermediate output in a database drawing in an intermediate output feature space according to the embodiment.

FIG. 4 is a diagram illustrating an example of a position of the intermediate output of the target drawing and a position of the intermediate output of the database drawing in an intermediate output feature space. As illustrated in FIG. 4, within a circle having a predetermined radius centered on the position of the intermediate output of the target drawing, a plurality of database drawings corresponding to the plurality of intermediate outputs have features similar to the features of the target drawing.

The similar drawing search unit 117 calculates a score used to identify a first similar drawing similar to the target drawing using the calculation formula stored in the memory 13. Specifically, the similar drawing search unit 117 calculates a sum of a multiplication value (hereinafter, referred to as a first weighted value) of the first weight and the intermediate output similarity and a multiplication value (hereinafter, referred to as a second weighted value) of the second weight and the characteristic similarity as a score. The smaller the score, the more similar the database drawing and the target drawing are. That is, the database drawing is similar to the target drawing in descending order of similarity (for example, in ascending order of scores). Note that, in a case where the intermediate output or the characteristic of the shape of the component is used as the feature regarding the shape of the component drawing in the target drawing, the score is the intermediate output similarity or the characteristic similarity itself.

Figure 5:
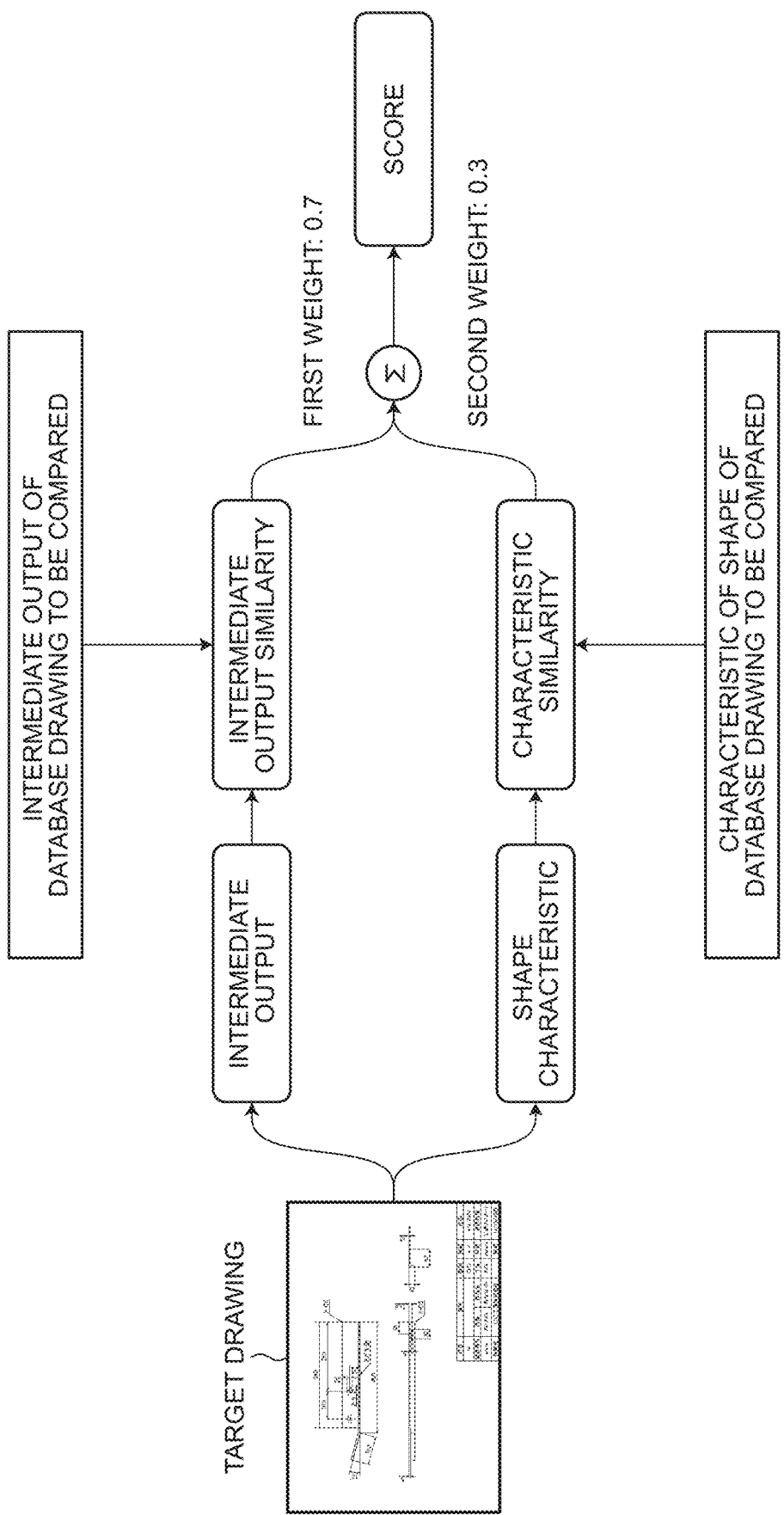
FIG. 5 is a diagram illustrating an example of a process of calculating a score according to the embodiment.

FIG. 5 is a diagram illustrating an example of a process of calculating a score. As illustrated in FIG. 5, the similar drawing search unit 117 calculates a score indicating similarity between the target drawing and the database drawing by using the characteristics of the intermediate output and the shape of the target drawing and the characteristics of the intermediate output and the shape of the database drawing. As described above, the similar drawing search unit 117 searches for a plurality of first similar drawings similar to the target drawing from the database drawing.

The drawing narrowing unit 119 narrows down a plurality of first similar drawings to a plurality of second similar drawings based on the drawing information of the target drawing. The plurality of second similar drawings are, for example, drawings more similar to the component drawings than the plurality of first similar drawings. Specifically, the drawing narrowing unit 119 narrows down the first similar drawing to the second similar drawing using partial matching between the drawing number, the figure number, the product name, the component name, the symbol information, and the like related to the target drawing and the drawing information related to the plurality of first similar drawings as a condition of narrowing down by the keyword.

In addition, the drawing narrowing unit 119 may narrow down the first similar drawing to the second similar drawing using, for example, a material, a surface treatment, and the like related to the component drawing in the target drawing as a large number of selection lists (multi picklists) for the drawing information related to the plurality of first similar drawings. Further, for example, the drawing narrowing unit 119 may narrow down the first similar drawing to the second similar drawing by using a dimension size related to the component drawing in the target drawing as designation of a range in the drawing information related to the plurality of first similar drawings. The drawing narrowing unit 119 outputs the second similar drawing narrowed down from the first similar drawing to the display 17.

The learning unit 121 is used, for example, to generate a learned model. The learning unit 121 applies the learning data to a model configured by a multilayer neural network before learning to generate a learned model. The learning data includes input data and teacher data (correct answer data). The input data is, for example, a component drawing. In addition, the teacher data is at least one of a plurality of items related to a product and processing including a product category corresponding to the component drawing, dimensions before and after processing, a processing process category, a processing method, presence or absence of bending processing, and presence or absence of welding processing. Since a known learning method can be used for the generation of the learned model, a description thereof will be omitted. Furthermore, the learning unit 121 sets the first weight and the second weight. The setting of the first weight and the second weight will be described later.

The configuration of the similar drawing search device 1 has been described above. Hereinafter, (hereinafter, referred to as a similar drawing search processing) related to searching for similar drawings by the similar drawing search device 1 will be described. The similar drawing search processing is to search a database drawing in the memory 13 for the first similar drawing similar to the target drawing based on the feature of the shape of the component drawing in the target drawing, and to narrow down at least one second similar drawing from the plurality of first similar drawings based on drawing information in the target drawing.

That is, the similar drawing search processing is to specify a similar drawing corresponding to the target drawing by two processing of searching for the plurality of first similar drawings based on the feature of the shape of the component drawing of the target drawing and narrowing down the plurality of first similar drawings to the plurality of second similar drawings based on drawing information of the target drawing. Hereinafter, in order to specifically describe the similar drawing search processing, the features of the target drawing acquired by the feature information acquisition unit 113 are the intermediate output and the shape characteristics of the component corresponding to the component drawing.

Figure 6:
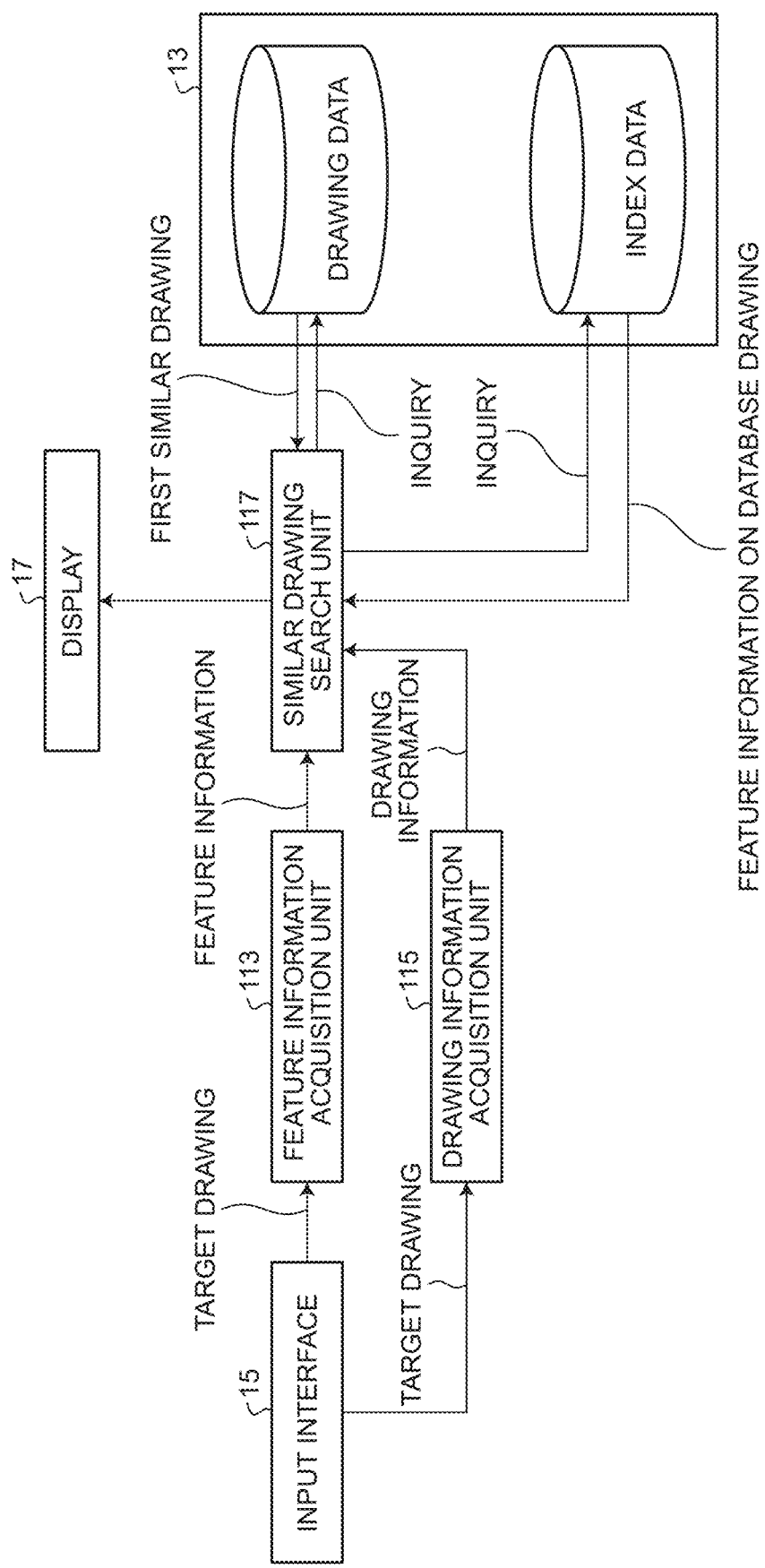
FIG. 6 is a diagram illustrating an example of a flow of data in similar drawing search processing according to the embodiment.
Figure 7:
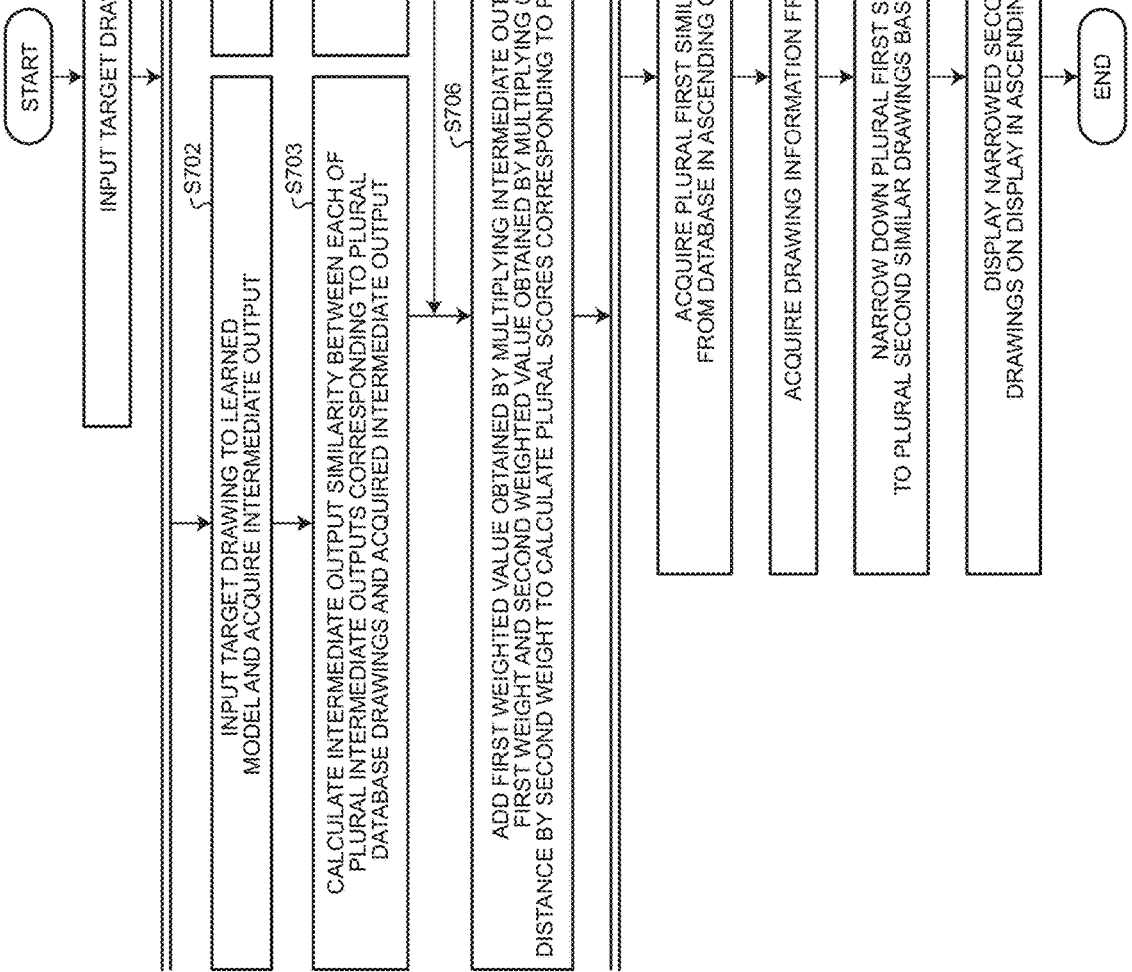
FIG. 7 is a diagram illustrating an example of a procedure in a similar drawing search processing according to the embodiment.

FIG. 6 is a diagram illustrating an example of a flow of data in the similar drawing search processing. FIG. 7 is a diagram illustrating an example of a procedure in the similar drawing search processing.

(Similar Drawing Search Processing)

(Step S701)

The input interface 15 inputs a target drawing according to an instruction of a user. Note that the input of the target drawing to the similar drawing search device 1 is not limited to the processing through the input interface 15. The target drawing may be input from an external input device through the communication interface 19 and the network 191, for example.

(Step S702)

The feature information acquisition unit 113 inputs the target drawing to the learned model and acquires an intermediate output. Note that the input to the learned model is not limited to the target drawing, and may be a component drawing extracted from the target drawing. At this time, the process related to the extraction of the component drawing from the target drawing is executed, for example, by the feature information acquisition unit 113 between steps S701 and S702.

(Step S703)

The similar drawing search unit 117 inquires index data in the memory 13 and reads the intermediate output related to the database drawing from the memory 13. The similar drawing search unit 117 calculates intermediate output similarity between each of the plurality of intermediate outputs corresponding to the plurality of database drawings read from the memory 13 and the acquired intermediate output. The intermediate output similarity is a cosine similarity or Euclidean distance as described above. Note that, in a case where the feature regarding the shape of the component drawing in the target drawing is only the intermediate output, the following processing in Steps S704 and S706 will be omitted.

(Step S704)

The feature information acquisition unit 113 acquires a characteristic of a component corresponding to a component drawing in a target drawing. As described above, the characteristic of the component is a characteristic related to an edge of the component defined from the component drawing. Note that the characteristic of the component is not limited to the characteristic related to the edge, and may be a characteristic that defines a characteristic of another component, for example, a shape such as a curvature of bending in the component.

(Step S705)

The similar drawing search unit 117 inquires index data in the memory 13 and reads characteristics related to the database drawing from the memory 13. The similar drawing search unit 117 calculates a characteristic similarity between each of a plurality of characteristics corresponding to a plurality of database drawings read from the memory 13 and the acquired characteristic. The characteristic similarity is a cosine similarity or Euclidean distance as described above. Note that, in a case where the feature regarding the shape of the component drawing in the target drawing is only the intermediate output, the processing in Steps S702 and S703 will be omitted.

(Step S706)

The similar drawing search unit 117 calculates a first weighted value by multiplying the intermediate output distance by a first weight, and calculates a second weighted value by multiplying the characteristic distance by a second weight. Next, the similar drawing search unit 117 calculates a plurality of scores corresponding to the plurality of database drawings by adding the first weighted value and the second weighted value. When the feature acquired by the feature information acquisition unit 113 is any one of the intermediate output and the shape characteristic, the similar drawing search unit 117 calculates the intermediate output distance or the characteristic distance as a score.

(Step S707)

The similar drawing search unit 117 makes an inquiry to the memory 13 in descending order of similarity (for example, the ascending order of the score, the descending order of the cosine similarity, and the like) using the drawing ID, and acquires a plurality of first similar drawings from the memory 13. As a result, the similar drawing search unit 117 completes searching of the plurality of first similar drawings from the drawing database. Note that the similar drawing search unit 117 may acquire (extract) a plurality of first similar drawings corresponding to a plurality of scores less than (or equal to or less than) a predetermined value from the drawing database in the memory 13.

(Step S708)

The drawing information acquisition unit 115 acquires, from a target drawing, drawing information on a component drawing of the target drawing. At this time, the drawing information acquisition unit 115 stores the acquired drawing information (for example, a text attached to the component drawing, and estimation information, symbol information, and the like estimated based on the text) in the memory 13 in association with the ID of the target drawing. Note that the drawing information can be appropriately selected, corrected, and the like according to a user's instruction through the input interface 15.

Figure 8:
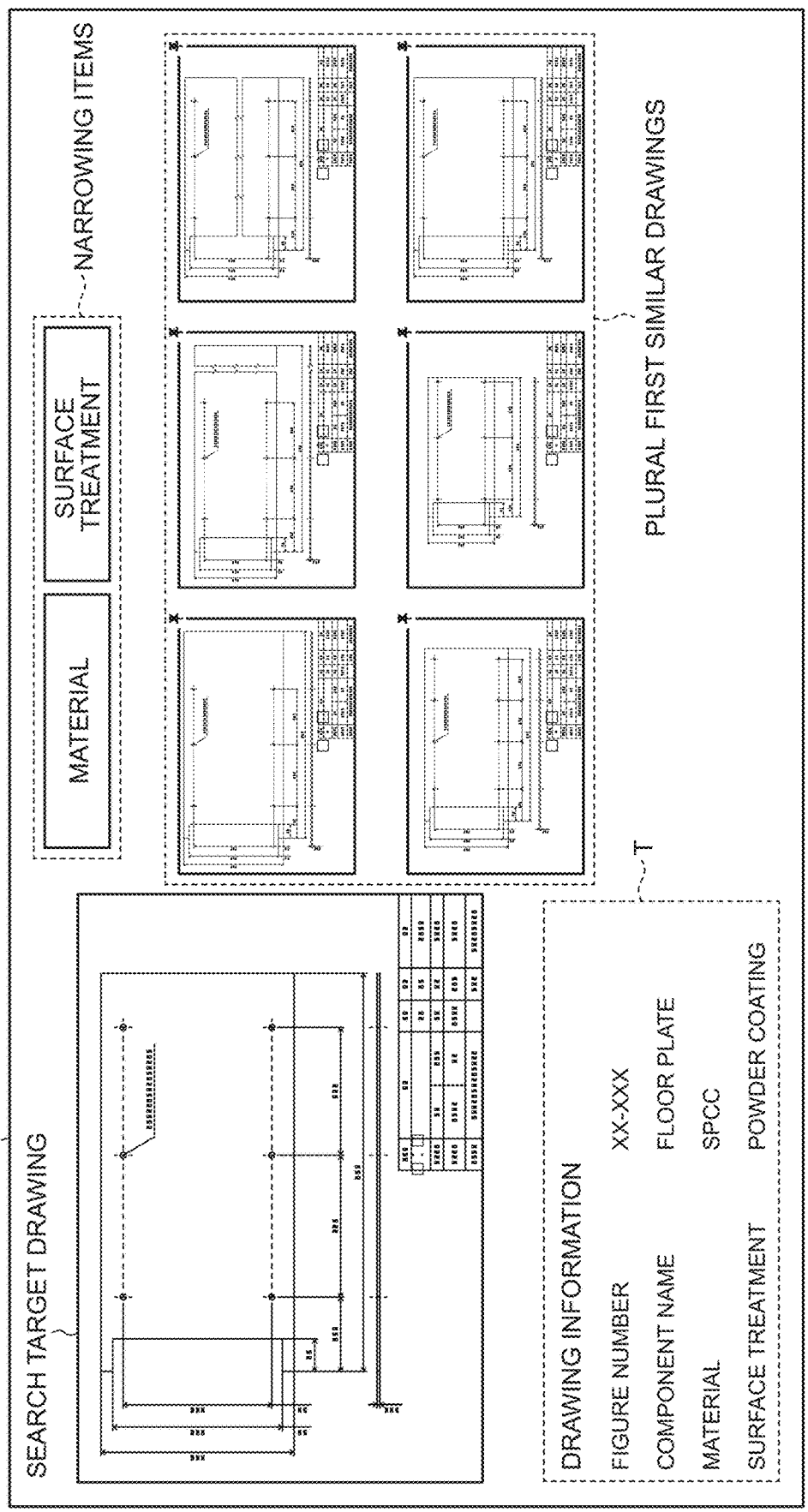
FIG. 8 is a diagram illustrating an example of display of a target drawing and a plurality of first similar drawings according to the embodiment.

In this step, the display 17 may display the target drawing and the plurality of first similar drawings in descending order of similarity (for example, the ascending order of the score, the descending order of the cosine similarity, and the like) under the control of the system control unit 111. FIG. 8 is a diagram illustrating an example of display of a target drawing and a plurality of first similar drawings. As illustrated in FIG. 8, in addition to the target drawing and the plurality of first similar drawings, drawing information of the target drawing and a button (narrowing item) for selecting an item of narrowing by the drawing narrowing unit 119 are further displayed on the display 17. At this time, when the narrowing item is selected according to the user's instruction through the input interface 15, the narrowing search in Step S709 in a subsequent stage is performed with the drawing information such as the material and the surface treatment regarding the target drawing.

(Step S709)

The drawing narrowing unit 119 narrows down a plurality of second similar drawings from a plurality of first similar drawings on the basis of the drawing information of the target drawing. That is, the drawing narrowing unit 119 narrows down a plurality of second similar drawings having a low score and meeting a narrowing condition based on the drawing information of the target drawing from the first similar drawings.

(Step S710)

The system control unit 111 causes the display 17 to display the narrowed second similar drawings in ascending order of scores, for example. Accordingly, the user can select a drawing similar to the target drawing from the list of the plurality of second similar drawings. A similar drawing desired by the user is selected from the plurality of second similar drawings by the user's selection instruction through the input interface 15. According to the above procedure, the similar drawing search processing is terminated.

Figure 9:
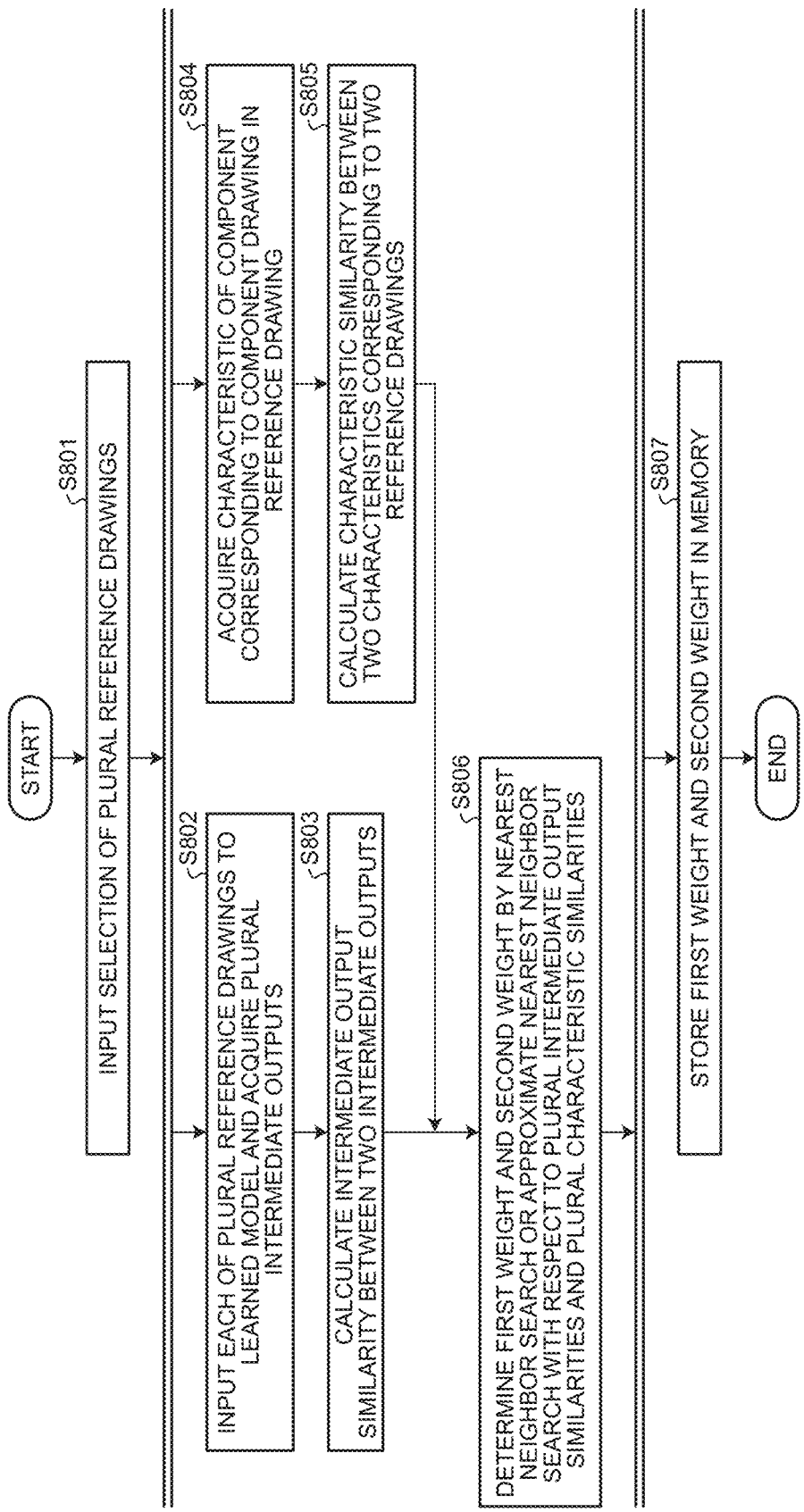
FIG. 9 is a diagram illustrating an example of a procedure in weight setting processing according to the embodiment.

Hereinafter, processing related to setting of the first weight and the second weight (hereinafter, referred to as weight setting processing) will be described. The weight setting processing is executed prior to the execution of the similar drawing search processing. FIG. 9 is a diagram illustrating an example of a procedure in the weight setting processing.

(Weight Setting Processing)
(Step S801)

The input interface 15 inputs selection of a plurality of drawings (hereinafter, referred to as reference drawings) regarding setting of the first weight and the second weight according to an instruction of the user. Note that input of selection of a plurality of reference drawings to the similar drawing search device 1 is not limited to processing through the input interface 15. Selection of the plurality of reference drawings may be input from an external input device through, for example, the communication interface 19 and the network 191.

(Step S802)

The feature information acquisition unit 113 inputs each of the plurality of reference drawings to the learned model, and acquires a plurality of intermediate outputs corresponding to the plurality of reference drawings. Note that the input to the learned model is not limited to the reference drawing, and may be a component drawing extracted from the reference drawing. At this time, the processing related to the extraction of the component drawing from the reference drawing is executed, for example, by the feature information acquisition unit 113 between Steps S801 and S802. When the intermediate output is stored in the memory 13 in advance, the feature information acquisition unit 113 acquires the intermediate output corresponding to the selected reference drawing from the memory 13.

(Step S803)

The similar drawing search unit 117 calculates intermediate output similarity between the two intermediate outputs. Since the calculation of the intermediate output similarity is similar to Step S703, a description thereof will be omitted.

(Step S804)

The feature information acquisition unit 113 acquires a characteristic of a component corresponding to the component drawing in the reference drawing. Acquisition of characteristics is similar to that in Step S704, and thus a description thereof will be omitted.

(Step S805)

The similar drawing search unit 117 calculates characteristic similarity between two characteristics. Since the calculation of the characteristic similarity is similar to Step S705, a description thereof will be omitted.

(Step S806)

The learning unit 121 applies a nearest neighbor search algorithm or an approximate nearest neighbor search algorithm to the plurality of intermediate output similarities (for example, the intermediate output distance) and the plurality of characteristic similarities (for example, the characteristic distance) according to the pair of reference drawings. As a result, the learning unit 121 determines the first weight and the second weight. Since the nearest neighbor search algorithm or the approximate nearest neighbor search algorithm has been known, a description thereof will be omitted. Note that the learning unit 121 may determine the first weight and the second weight such that the intermediate output distance and the characteristic class distance are in the vicinity of a predetermined distance value. In addition, the first weight and the second weight may be determined and/or adjusted by an instruction of the user through the input interface 15.

(Step S807)

The learning unit 121 stores the first weight and the second weight in the memory 13. In addition, the learning unit 121 stores the plurality of reference drawings, the intermediate output, and the characteristic in the memory 13 as index data in association with each other by the drawing ID. Thus, the weight setting processing is completed.

From the above, the similar drawing search device 1 according to the embodiment acquires the drawing information related to the component drawing in the target drawing from the target drawing, searches the drawing database for the plurality of first similar drawings based on the feature information of the target drawing, narrows down the plurality of first similar drawings to the plurality of second similar drawings based on the drawing information of the target drawing, and displays the plurality of second similar drawings on the display 17. In addition, when the similar drawing search device 1 according to the embodiment inputs the target drawing to the learned model and acquires at least one of the intermediate output output from at least one intermediate layer in the learned model and the characteristic of the shape of the component in the component drawing of the target drawing using the image processing on the component drawing of the target drawing as the feature information of the target drawing, the similar drawing search device 1 according to the embodiment extracts the area of the component drawing of the target drawing from the drawing of the target drawing and acquires the feature of the target drawing from the component drawing of the target drawing. In the similar drawing search device 1 according to the embodiment, the drawing information of the target drawing includes at least one of text attached to the component drawing, estimation information estimated based on the text, and symbol information attached to the component drawing of the target drawing.

For example, when the feature information of the target drawing has the intermediate output and the characteristic, the similar drawing search device 1 according to the embodiment searches for the plurality of first similar drawings based on the intermediate output similarity between the intermediate output of the target drawing and each of the plurality of intermediate outputs stored in the drawing database and the characteristic similarity between the characteristic of the target drawing and each of the plurality of characteristics corresponding to the plurality of intermediate outputs stored in the drawing database. At this time, the similar drawing search device 1 according to the embodiment calculates a score by adding a first weighted value obtained by multiplying the intermediate output similarity by the first weight and a second weighted value obtained by multiplying the characteristic similarity by the second weight, and searches for the plurality of first similar drawings using the score.

In addition, the learned model used in the similar drawing search device 1 according to the embodiment is generated by inputting each of the plurality of drawings (database drawings) stored in the drawing database to the model before learning and causing the model before learning to learn using each of the plurality of estimation results corresponding to the plurality of database drawings as teacher data. At this time, each of the plurality of estimation results according to the embodiment is, for example, at least one of a plurality of items regarding a product and processing including a product category, dimensions before and after processing, a processing process category, a processing method, presence or absence of bending processing, and presence or absence of welding processing.

Thus, according to the similar drawing search device 1 of the embodiment, it is possible to search for the first similar drawing similar to the target drawing from the database drawing in the memory 13 based on the feature of the shape of the component drawing in the target drawing, and at least one second similar drawing can be narrowed down from the plurality of first similar drawings based on the drawing information in the target drawing. Therefore, according to the similar drawing search device 1 according to the embodiment, it is possible to more efficiently search similar drawings having higher similarity from the target drawings by two search processing of searching for a plurality of first similar drawings based on the feature of the shape of the component drawing and narrowing down the plurality of first similar drawings to a plurality of second similar drawings based on the drawing information.

As described above, according to the similar drawing search device 1 according to the embodiment, it is possible to easily search for a similar drawing even if the requirement regarding the similarity between the past drawing and a desired drawing is complicated. As a result, according to the similar drawing search device 1 according to the embodiment, for example, it is possible to improve the efficiency of the ordering and receiving service of the drawings.

Application Example

In a case where the intermediate output similarity is an intermediate output distance between the acquired intermediate output and each of the plurality of intermediate outputs stored in the drawing database, and the characteristic similarity is a characteristic distance between the acquired characteristic and each of the plurality of characteristics corresponding to the plurality of intermediate outputs, the present application example is to execute distance learning based on a characteristic acquired from a plurality of pairs of two drawings designated by the user for a metric (metric: measurement) in at least one of the intermediate output distance and the characteristic distance.

Figure 10:
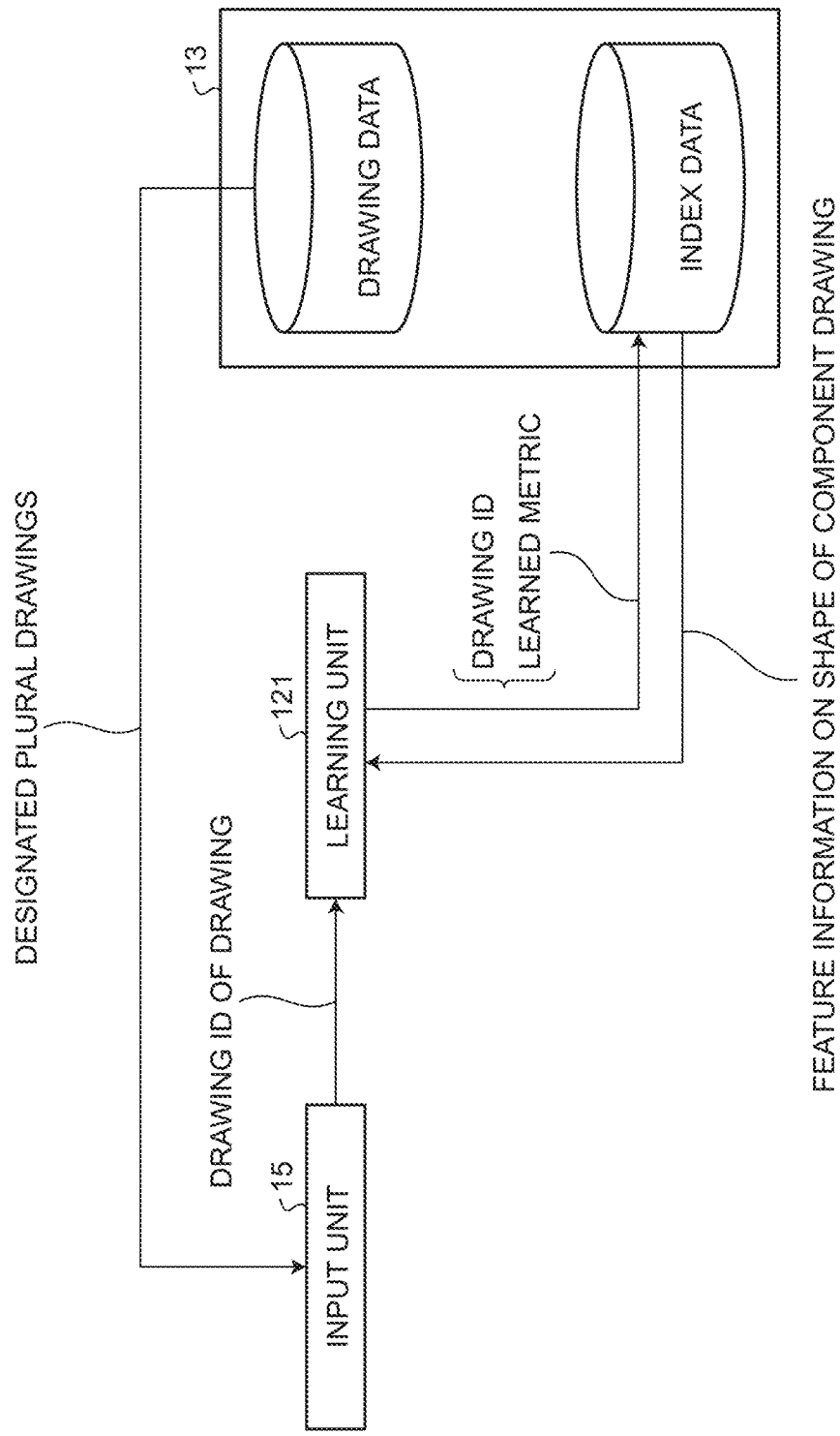
FIG. 10 is a diagram illustrating an example of a flow of data in distance learning processing according to an application example of the embodiment.
Figure 11:
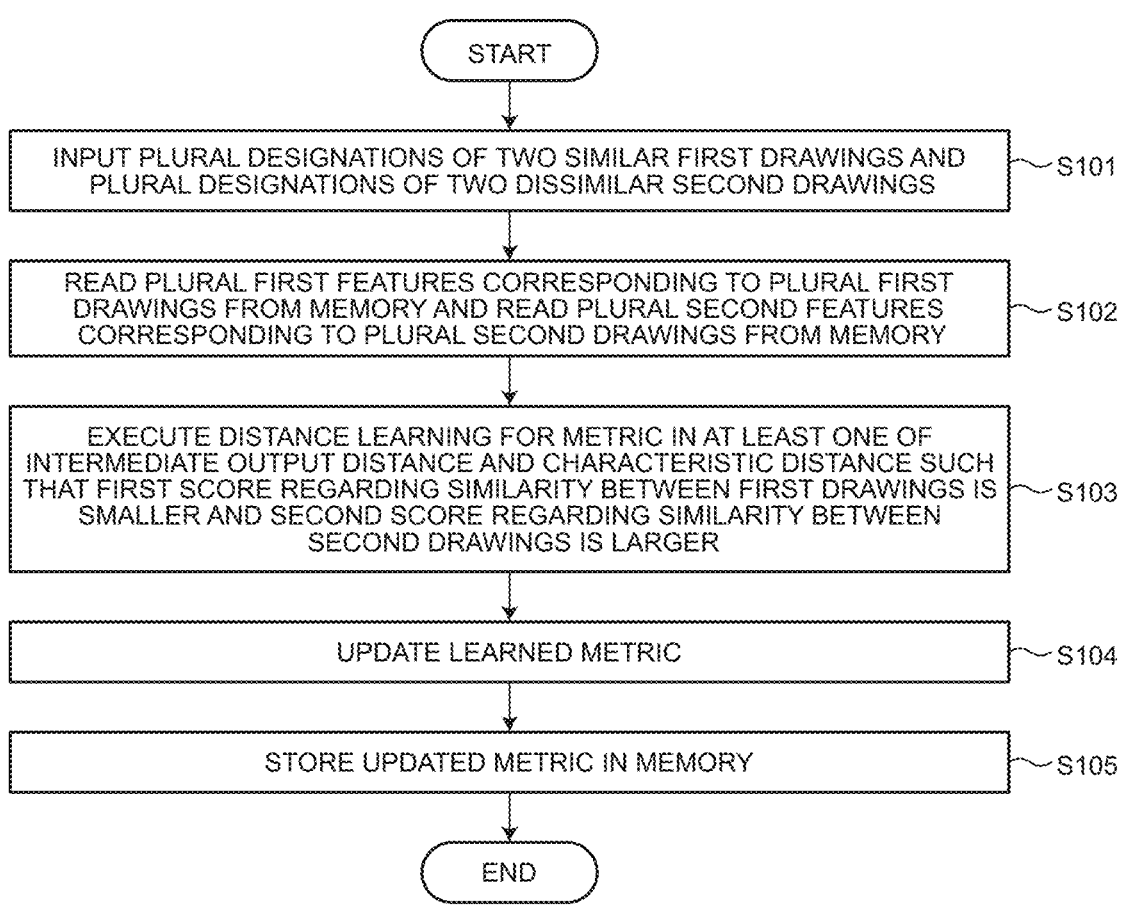
FIG. 11 is a flowchart illustrating an example of a procedure in distance learning processing according to an application example of the embodiment.

Hereinafter, a process of executing distance learning (hereinafter, referred to as distance learning processing) will be described. FIG. 10 is a diagram illustrating an example of a flow of data in the distance learning processing. FIG. 11 is a flowchart illustrating an example of a procedure in the distance learning processing.
(Distance Learning Processing)
(Step S101)

The input interface 15 inputs a plurality of designations of two similar first drawings and a plurality of designations of two dissimilar second drawings according to a user's instruction. The input interface 15 outputs two drawing ID corresponding to two designated drawings to the learning unit 121.
(Step S102)

The learning unit 121 collates two drawing IDs corresponding to the two first drawings with a plurality of drawing IDs stored in the index data. The learning unit 121 reads the first features corresponding to the two collated drawing IDs from the memory 13. In addition, the learning unit 121 collates two drawing ID corresponding to two second drawings with a plurality of drawing IDs stored in the index data. The learning unit 121 reads the second features corresponding to the two collated drawing IDs from the memory 13. That is, the learning unit 121 reads the plurality of first features corresponding to the plurality of first drawings and the plurality of second features corresponding to the plurality of second drawings, using the drawing ID from the memory 13.

Specifically, the learning unit 121 sets a set of first drawings (drawings similar to each other) and a set of second drawings (drawings not similar to each other) as S and D as shown in the following Expression (3). In the following Expression (3), ($x_i$, $x_j$) represent designated drawings.

$$S:\{(x_i,x_j):x_i,x_j \text{ are similar}\}$$

$$D:\{(x_i,x_j):x_i,x_j \text{ are not similar}\} \quad (3)$$

(Step S103)

The learning unit 121 executes distance learning for the metric in at least one of the intermediate output distance and the characteristic distance such that the first score regarding the similarity between the first drawings is decreased and the second score regarding the similarity between the second drawings is increased. Specifically, the learning unit 121 executes, for example, Mahalanobis Distance Metric Learning by using the vectors included in the sets S and D. In the Mahalanobis distance learning, the learning unit 121 learns a covariance matrix M using the following Expression (4). That is, the learned metric corresponds to the covariance matrix M. A left side in Expression (4) indicates the Mahalanobis distance regarding the images x and y. The images x and y belong to the set S or D. x and y on the right side indicate vectors (for example, a vector representing an intermediate output) related to feature information of the images x and y.

$$d_M(x,y) = \sqrt{(x-y)^T M(x-y)} \quad (4)$$

In the Mahalanobis distance learning, the learning unit 121 solves an optimization problem represented by the following Expression (5).

$$\begin{aligned}
&\underset{M}{\text{maximize}} \sum_{(x_i,x_j) \in D} d_M(x_i, x_j) \\
&\text{subject to } \sum_{(x_i,x_j) \in S} d_M^2(x_i, x_j) \leq 1, \\
&M \succeq 0.\ S:\{(x_i, x_j):x_i, x_j \text{ are similar}\} \\
&D:\{(x_i, x_j):x_i, x_j \text{ are not similar}\}
\end{aligned} \quad (5)$$

The learning unit 121 executes Mahalanobis distance learning so as to reduce the distance between samples of the same class (intra-class), that is, the same set, and to increase the distance between samples of different classes (inter-class), that is, different sets. A known technique can be applied to an actual processing procedure of the Mahalanobis distance learning, and thus a description thereof will be omitted. Although the Mahalanobis distance learning has been described as an example of the distance learning, the distance learning is not limited thereto, and other known distance learning may be used. The algorithm related to distance learning is stored in the memory 13 in advance.
(Step S104)

The learning unit 121 updates the metric learned by distance learning. The metric before execution of the distance learning in the application example is an identity matrix corresponding to the dimension (the number of elements) of the vector, as shown in Expression (2). In the first-stage distance learning, the learning unit 121 updates the identity matrix to the learned metric. Thereafter, the learning unit 121 updates the metric according to the execution of the distance learning.

(Step S105)

The learning unit 121 transmits the updated metric to the memory 13 and stores the updated metric in the memory 13 together with the index data. The metric stored in the memory 13 is used in the similar drawing search processing.

Note that frequent use of the distance learning processing may lead to over-learning of the metric. Therefore, as a modification of the present application example, the distance learning processing may further include a process of suppressing over-learning of distance learning, that is, a process of balancing improvement in accuracy of searching for similar drawings with over-learning (hereinafter, referred to as balance processing). As the balance process, a known process can be applied, and thus a description thereof will be omitted.

As described above, in the similar drawing search device 1 according to the application example of the embodiment, when the intermediate output similarity is the intermediate output distance between the intermediate output of the target drawing and each of the plurality of intermediate outputs stored in the drawing database, and the characteristic similarity is the characteristic distance between the characteristic of the target drawing and each of the plurality of characteristics corresponding to the plurality of intermediate outputs stored in the drawing database, the similar drawing search device 1 inputs a plurality of designations of two similar first drawings and designations of two dissimilar second drawings, and executes distance learning for the metric in at least one of the intermediate output distance and the characteristic distance such that the first score regarding the similarity between the two first drawings is smaller and the second score regarding the similarity between the two second drawings is larger.

As a result, according to the similar drawing search device 1 according to the present application example, distance learning can be executed according to a purpose of searching for a similar drawing by the user. Therefore, according to the similar drawing search device 1 according to the present application example, the accuracy of searching for similar drawings can be improved. Since other effects are substantially the same as those of the embodiment, a description thereof will be omitted.

A modification of the present application example is to perform distance learning in a case where two similar and dissimilar drawings are not designated in the distance learning procedure. For example, the learning unit 121 performs clustering using the feature information acquired by the feature information acquisition unit 113, and executes distance learning for a metric in at least one of the intermediate output distance and the characteristic distance such that a score regarding similarity between drawings included in the same cluster is er and a score regarding similarity between drawings included in different clusters is larger. According to a modification of the present application example, the following processing is executed instead of the processing of Steps S101 and S102 in the distance learning processing. The learning unit 121 performs clustering using the feature information acquired by the feature information acquisition unit 113. The learning unit 121 specifies the elements of the sets S and D by the clustering. Since the subsequent processing conforms to the processing after Step S103 in the application example, a description thereof will be omitted.

As described above, in the similar drawing search device 1 according to the modification of the application example of the embodiment, in a case where the intermediate output similarity is the intermediate output distance between the intermediate output of the target drawing and each of the plurality of intermediate outputs stored in the drawing database, and the characteristic similarity is the characteristic distance between the characteristic of the target drawing and each of the plurality of characteristics corresponding to the plurality of intermediate outputs stored in the drawing database, the similar drawing search device 1 performs clustering using the characteristic information acquired by the feature information acquisition unit 113, and performs distance learning on the metric in at least one of the intermediate output distance and the characteristic distance such that the score regarding the similarity between the drawings included in the same cluster is small and the score regarding the similarity between the drawings included in another cluster is large.

According to the modification of the present application example, since it is not necessary for the user to designate the drawing, burden of the operation on the user is reduced. As a result, according to the similar drawing search device 1 according to the modification of the present application example, the operability with respect to the distance learning is improved, and the distance learning can be executed more easily. Other effects are similar to those of the application example, and thus a description thereof will be omitted.

In a case where the technical idea according to the embodiment is realized by a similar drawing searching method, the similar drawing searching method is a similar drawing searching method of searching for a drawing similar to a target drawing from a drawing database in which feature information regarding a shape of a component in each drawing and drawing information regarding the component in each drawing are stored in association with each other with respect to a plurality of drawings, including: acquiring feature information regarding a shape of the component in the target drawing from the target drawing; acquiring drawing information regarding the component in the target drawing from the target drawing; searching for a plurality of first similar drawings from the drawing database based on the feature information of the target drawing; narrowing down the plurality of first similar drawings to a plurality of second similar drawings based on the drawing information of the target drawing; and displaying the plurality of second similar drawings on a display 17. Processing contents, effects, and the like in each step of the similar drawing search processing realized by the similar drawing search method are similar to those in the embodiment, and thus, a description thereof will be omitted.

When the technical idea according to the embodiment is realized by a similar drawing search program, the similar drawing search program causes a computer to search for a drawing similar to a target drawing from a drawing database that stores feature information on a shape of a component in each drawing and drawing information on the component in each drawing in association with each other for a plurality of drawings, the similar drawing search program causing the computer to acquire the feature information on the shape of the component in the target drawing from the target drawing, acquire the drawing information on the component in the target drawing from the target drawing, search for a plurality of first similar drawings from the drawing database based on the feature information of the target drawing, narrow down the plurality of first similar drawings to a plurality of second similar drawings based on the drawing information of the target drawing, and display the plurality of second similar drawings on a display 17. At this time, the program that can cause the computer to execute the technique can be distributed by being stored in a storage medium such as a magnetic disk (hard disk or the like), an optical disk (CD-ROM, DVD, etc.), or a semiconductor memory. Processing contents, effects, and the like in each step of the similar drawing search processing realized by the similar drawing search program are similar to those in the embodiment, and thus, a description thereof will be omitted.

According to at least one embodiment and the like described above, it is possible to easily search for a similar drawing.

Although some embodiments have been described in detail above, the disclosure according to the embodiments is not limited to the individual embodiments described above. These embodiments can be implemented in various other forms, and various partial omissions, additions, substitutions, changes, and the like can be made without departing from the gist of the invention. In addition, these embodiments and modifications thereof are included in the scope and gist of the invention and are included in the invention described in the claims and the equivalent scope thereof. In addition, the order of each processing in the embodiment is illustrated as an example, and the present invention is not limited thereto.

What is claimed is:

1. A similar drawing search device configured to search for a drawing similar to a target drawing from a drawing database that stores feature information on a shape of a component in each drawing and drawing information on the component in the drawing in association with each other for a plurality of drawings, the similar drawing search device comprising:
    a feature information acquisition unit configured to acquire, from the target drawing, feature information related to a shape of a component in the target drawing;
    a drawing information acquisition unit configured to acquire, from the target drawing, drawing information on the component in the target drawing;
    a similar drawing search unit configured to search the drawing database for a plurality of first similar drawings, based on the feature information of the target drawing;
    a drawing narrowing unit configured to narrow down the plurality of first similar drawings to a plurality of second similar drawings, based on the drawing information of the target drawing; and
    a display unit configured to display the plurality of second similar drawings.

2. The similar drawing search device according to claim 1, wherein
    the feature information acquisition unit is configured to acquire, as the feature information of the target drawing, at least one of:
        an intermediate output that is output from at least one intermediate layer of a learned model by inputting the target drawing to the learned model, the learned model being configured to output an estimation result estimated based on the feature information of the target drawing with the target drawing as an input; and
        a characteristic of the shape of the component in the component of the target drawing using image processing on the component of the target drawing.

3. The similar drawing search device according to claim 2, wherein
    the learned model is generated by inputting each of the plurality of drawings stored in the drawing database to a model before learning and causing the model before learning to learn by using each of a plurality of estimation results corresponding to the plurality of drawings as teacher data, and
    each of the plurality of estimation results is at least one of a plurality of items related to a product or processing, the plurality of items including a product category, dimensions before and after processing, a processing process category, a processing method, presence or absence of bending, and presence or absence of welding.

4. The similar drawing search device according to claim 2, wherein
    the similar drawing search unit is configured to search for the plurality of first similar drawings, based on intermediate output similarity between the intermediate output of the target drawing and each of a plurality of intermediate outputs stored in the drawing database, and characteristic similarity between the characteristic of the target drawing and each of a plurality of characteristics corresponding to the plurality of intermediate outputs stored in the drawing database, when the feature information of the target drawing has the intermediate output and the characteristic.

5. The similar drawing search device according to claim 4, wherein
    the similar drawing search unit is configured to:
        calculate a score by adding a first weighted value obtained by multiplying the intermediate output similarity by a first weight and a second weighted value obtained by multiplying the characteristic similarity by a second weight; and
        search for the plurality of first similar drawings using the score.

6. The similar drawing search device according to claim 4, wherein
    the intermediate output similarity is an intermediate output distance between the intermediate output of the target drawing and each of the plurality of intermediate outputs stored in the drawing database,
    the characteristic similarity is a characteristic distance between the characteristic of the target drawing and each of the plurality of characteristics corresponding to the plurality of intermediate outputs stored in the drawing database, and
    the similar drawing search device further comprises:
        an input unit configured to input a plurality of designations of two similar first drawings and a plurality of designations of two dissimilar second drawings; and
        a learning unit configured to execute distance learning for a metric in at least one of the intermediate output distance and the characteristic distance such that a first score related to similarity between the two first drawings is smaller and a second score related to similarity between the two second drawings is larger.

7. The similar drawing search device according to claim 6, wherein
    the metric is a metric used to calculate the intermediate output distance.

8. The similar drawing search device according to claim 4, wherein
    the intermediate output similarity is an intermediate output distance between the intermediate output of the target drawing and each of the plurality of intermediate outputs stored in the drawing database, the characteristic similarity is a characteristic distance between the characteristic of the target drawing and each of the plurality of characteristics corresponding to the plurality of intermediate outputs stored in the drawing database, and the similar drawing search device further comprises a learning unit configured to perform clustering using the feature information acquired by the feature information acquisition unit, and execute distance learning for a metric in at least one of the intermediate output distance and the characteristic distance such that a score regarding similarity between drawings included in a same cluster is smaller and a score regarding similarity between drawings included in different clusters is larger.

9. The similar drawing search device according to claim 1, wherein the drawing information of the target drawing includes at least one of a text attached to the component, estimation information estimated based on the text, and symbol information attached to the component.

10. The similar drawing search device according to claim 1, wherein the feature information acquisition unit is configured to extract an area of the component of the target drawing from a drawing corresponding to the target drawing, and acquire the feature of the target drawing from the component of the target drawing.

11. A similar drawing search method of searching for a drawing similar to a target drawing from a drawing database in which feature information regarding a shape of a component in each drawing and drawing information regarding the component in the drawing are stored in association with each other for a plurality of drawings, the similar drawing searching method comprising:

acquiring, from the target drawing, feature information regarding a shape of the component in the target drawing;

acquiring, from the target drawing, drawing information regarding the component in the target drawing;

searching for a plurality of first similar drawings from the drawing database, based on the feature information of the target drawing;

narrowing down the plurality of first similar drawings to a plurality of second similar drawings, based on the drawing information of the target drawing; and displaying the plurality of second similar drawings on a display.

12. A non-transitory computer-readable medium on which programmed instructions are stored, wherein the programmed instructions, when executed by a computer, causes the computer to search for a drawing similar to a target drawing from a drawing database in which feature information regarding a shape of a component in each drawing and drawing information regarding the component in the drawing are stored in association with each other for a plurality of drawings, the programmed instructions causing the computer to:

acquire, from the target drawing, feature information regarding a shape of the component in the target drawing;

acquire, from the target drawing, drawing information regarding the component in the target drawing;

search for a plurality of first similar drawings from the drawing database, based on the feature information of the target drawing;

narrow down the plurality of first similar drawings to a plurality of second similar drawings, based on the drawing information of the target drawing; and display the plurality of second similar drawings on a display.

\* \* \* \* \*